US012676615B2

(12) United States Patent
Korol et al.

(10) Patent No.: US 12,676,615 B2
(45) Date of Patent: Jul. 7, 2026

(54) DIGITAL LOGIC COMPATIBLE INPUTS IN COMPOUND SEMICONDUCTOR CIRCUITS

(71) Applicant: Renesas Electronics America Inc., Milpitas, CA (US)

(72) Inventors: Victor Korol, San Diego, CA (US); Roberto Aparicio Joo, San Diego, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 152 days.

(21) Appl. No.: 17/586,860

(22) Filed: Jan. 28, 2022

(65) Prior Publication Data

US 2022/0224336 A1      Jul. 14, 2022

Related U.S. Application Data

(62) Division of application No. 16/220,399, filed on Dec. 14, 2018, now Pat. No. 11,271,566.

(51) Int. Cl.
| | |
|---|---|
| *H03K 19/094* | (2006.01) |
| *H02P 9/30* | (2006.01) |
| *H10D 84/05* | (2025.01) |
| *H10W 20/44* | (2026.01) |
| *H10W 74/10* | (2026.01) |

(52) U.S. Cl.
CPC ....... H03K 19/09403 (2013.01); H02P 9/305 (2013.01); H10D 84/05 (2025.01); H10W 20/4403 (2026.01); H10W 74/129 (2026.01)

(58) Field of Classification Search
CPC .......... G11C 5/147; G11C 5/14; G11C 5/148; G11C 7/10; H01L 21/8252; H03K 19/0944; H03K 19/0005; H03K 19/09403; H03K 19/0813; H03K 19/082; H03K 19/1733; H03K 19/00384; H03K 19/0016; H03K 17/693; H03K 17/6872
See application file for complete search history.

(56) References Cited

U.S. PATENT DOCUMENTS

| | | | | |
|---|---|---|---|---|
| 3,714,463 A | * | 1/1973 | Laune ................... | H03L 7/0891 327/39 |
| 4,119,896 A | * | 10/1978 | Estes, III ................ | E05F 15/79 318/447 |
| 4,190,802 A | * | 2/1980 | Levine ................ | H04L 27/2337 375/283 |
| 4,994,729 A | * | 2/1991 | Taylor .................... | G05F 3/247 323/907 |
| 5,347,490 A | * | 9/1994 | Terada ................... | G11C 16/30 365/185.11 |

(Continued)

*Primary Examiner* — Sophia T Nguyen

(74) *Attorney, Agent, or Firm* — SCULLY, SCOTT, MURPHY & PRESSER, P.C.

(57) ABSTRACT

An apparatus includes a device comprising a semiconductor junction configured to generate a reference voltage, a voltage divider circuit, a comparator circuit, and a first output circuit. The voltage divider circuit may be configured to generate a first predetermined threshold voltage in response to the reference voltage. The comparator circuit may be configured to generate a first intermediate signal in response to a comparison of the first predetermined threshold voltage and an input signal. The first output circuit may be configured to generate a first output signal in response to the first intermediate signal.

13 Claims, 6 Drawing Sheets

(56)                References Cited

U.S. PATENT DOCUMENTS

| | | | | | |
|---|---|---|---|---|---|
| 5,397,934 A * | 3/1995 | Merrill | G05F 3/242 | | |
| | | | 327/537 | | |
| 5,814,979 A * | 9/1998 | Grimm | H02M 3/156 | | |
| | | | 323/284 | | |
| 5,821,808 A * | 10/1998 | Fujima | G11C 5/147 | | |
| | | | 327/87 | | |
| 5,835,420 A * | 11/1998 | Lee | G11C 16/30 | | |
| | | | 365/189.11 | | |
| 5,838,192 A * | 11/1998 | Bowers | G05F 3/247 | | |
| | | | 327/543 | | |
| 5,875,133 A * | 2/1999 | Miyashita | G11C 8/08 | | |
| | | | 365/233.5 | | |
| 5,917,759 A * | 6/1999 | Akashi | G11C 7/1078 | | |
| | | | 365/189.09 | | |
| 5,923,211 A * | 7/1999 | Maley | G05F 1/46 | | |
| | | | 327/540 | | |
| 5,955,872 A * | 9/1999 | Grimm | H02M 3/1588 | | |
| | | | 323/283 | | |
| 6,009,022 A * | 12/1999 | Lee | G11C 8/08 | | |
| | | | 365/189.11 | | |
| 6,052,325 A * | 4/2000 | Merritt | G11C 5/143 | | |
| | | | 365/189.09 | | |
| 6,185,145 B1 * | 2/2001 | Merritt | G11C 5/14 | | |
| | | | 365/189.09 | | |
| 6,515,903 B1 * | 2/2003 | Le | G11C 16/30 | | |
| | | | 327/536 | | |
| 6,529,422 B1 * | 3/2003 | Mazumder | G11C 5/147 | | |
| | | | 365/207 | | |
| 6,590,236 B1 * | 7/2003 | El-Zein | H01L 21/31691 | | |
| | | | 257/E21.127 | | |
| 6,826,103 B2 * | 11/2004 | Moon | G11C 7/14 | | |
| | | | 365/185.21 | | |
| 6,865,653 B2 * | 3/2005 | Zaccarin | G06F 1/3296 | | |
| | | | 713/300 | | |
| 6,963,218 B1 * | 11/2005 | Alexander | H03K 17/167 | | |
| | | | 326/26 | | |
| 7,057,969 B2 * | 6/2006 | Chow | G11C 11/2293 | | |
| | | | 365/207 | | |
| 7,395,445 B1 * | 7/2008 | Ramsay | G11C 5/147 | | |
| | | | 365/228 | | |
| 7,397,710 B2 * | 7/2008 | Takahashi | G11C 11/4085 | | |
| | | | 327/543 | | |
| 7,474,582 B2 * | 1/2009 | Mair | G11C 5/147 | | |
| | | | 365/189.09 | | |
| 7,532,142 B1 * | 5/2009 | Voegeli | H03M 1/0602 | | |
| | | | 341/145 | | |
| 7,868,605 B1 * | 1/2011 | Liu | G11C 5/147 | | |
| | | | 323/284 | | |
| 7,881,144 B1 * | 2/2011 | Maung | G11C 5/147 | | |
| | | | 327/143 | | |
| 7,969,797 B2 * | 6/2011 | Kang | G11C 5/147 | | |
| | | | 365/189.08 | | |
| 7,994,960 B1 * | 8/2011 | Li | H03M 1/0678 | | |
| | | | 341/158 | | |
| 7,999,558 B2 * | 8/2011 | Lyles | G01R 19/1659 | | |
| | | | 324/522 | | |
| 8,525,822 B2 * | 9/2013 | Liu | G09G 3/3688 | | |
| | | | 345/98 | | |
| 8,705,300 B1 * | 4/2014 | Xu | G11C 29/08 | | |
| | | | 365/201 | | |
| 9,148,144 B1 * | 9/2015 | Liu | H03K 19/0008 | | |
| 9,343,139 B2 * | 5/2016 | Campbell | G11C 7/12 | | |
| 10,319,719 B2 * | 6/2019 | Lee | G05F 3/242 | | |
| 10,600,494 B2 * | 3/2020 | Jimenez-Olivares | | | |
| | | | G11C 29/028 | | |
| 10,686,440 B2 * | 6/2020 | Joo | H03K 17/6872 | | |
| 10,910,071 B2 * | 2/2021 | Baek | H02M 1/08 | | |
| 11,232,818 B2 * | 1/2022 | Bae | G11C 29/028 | | |
| 11,295,787 B1 * | 4/2022 | Gunther | G11C 5/147 | | |
| 11,424,749 B1 * | 8/2022 | Chieh | H03L 7/095 | | |
| 2001/0004126 A1 * | 6/2001 | Ohlhoff | H01L 22/34 | | |
| | | | 257/E21.526 | | |
| 2002/0030523 A1 * | 3/2002 | Muljono | H03K 19/0005 | | |
| | | | 327/170 | | |
| 2002/0070793 A1 * | 6/2002 | Ochi | G05F 3/30 | | |
| | | | 327/539 | | |
| 2002/0075035 A1 * | 6/2002 | Roth | H03K 19/00323 | | |
| | | | 326/82 | | |
| 2002/0105062 A1 * | 8/2002 | Kikuchi | H01L 27/1203 | | |
| | | | 257/E23.079 | | |
| 2002/0125938 A1 * | 9/2002 | Kim | G05F 3/267 | | |
| | | | 327/539 | | |
| 2002/0131314 A1 * | 9/2002 | Watanabe | H03K 19/00384 | | |
| | | | 365/189.11 | | |
| 2002/0163373 A1 * | 11/2002 | Lin | H03K 3/0377 | | |
| | | | 327/205 | | |
| 2003/0001807 A1 * | 1/2003 | Debiez | H04N 1/401 | | |
| | | | 345/82 | | |
| 2003/0016056 A1 * | 1/2003 | Matsuzaki | H03M 5/02 | | |
| | | | 326/86 | | |
| 2003/0022466 A1 * | 1/2003 | Escalera | H01L 27/0605 | | |
| | | | 257/E21.12 | | |
| 2003/0038653 A1 * | 2/2003 | Ooishi | G11C 5/147 | | |
| | | | 326/33 | | |
| 2003/0043640 A1 * | 3/2003 | Marr | G11C 11/412 | | |
| | | | 365/189.09 | | |
| 2003/0117751 A1 * | 6/2003 | Murabayashi | H01L 27/0629 | | |
| | | | 361/1 | | |
| 2003/0201482 A1 * | 10/2003 | Shimoida | H01L 21/8213 | | |
| | | | 257/302 | | |
| 2004/0001385 A1 * | 1/2004 | Kang | G11C 5/147 | | |
| | | | 365/226 | | |
| 2004/0017690 A1 * | 1/2004 | Lee | G11C 5/147 | | |
| | | | 365/145 | | |
| 2004/0021512 A1 * | 2/2004 | Tanaka | H03F 3/2171 | | |
| | | | 330/10 | | |
| 2004/0100240 A1 * | 5/2004 | Natsume | H03K 17/6871 | | |
| | | | 323/282 | | |
| 2004/0145362 A1 * | 7/2004 | Lin | G05F 3/262 | | |
| | | | 323/316 | | |
| 2004/0268161 A1 * | 12/2004 | Ross | G11C 5/147 | | |
| | | | 713/300 | | |
| 2005/0157781 A1 * | 7/2005 | Ho | H04L 25/03343 | | |
| | | | 375/233 | | |
| 2005/0168242 A1 * | 8/2005 | Won | H03K 19/0963 | | |
| | | | 326/82 | | |
| 2005/0261821 A1 * | 11/2005 | Abe | F02D 41/266 | | |
| | | | 701/111 | | |
| 2006/0007616 A1 * | 1/2006 | Pan | G11C 5/147 | | |
| | | | 361/90 | | |
| 2006/0170403 A1 * | 8/2006 | Im | G05F 1/575 | | |
| | | | 323/280 | | |
| 2006/0181304 A1 * | 8/2006 | Dreps | H03K 19/0005 | | |
| | | | 326/30 | | |
| 2006/0185429 A1 * | 8/2006 | Liu | B60C 23/0408 | | |
| | | | 73/146.5 | | |
| 2006/0238234 A1 * | 10/2006 | Benelbar | G05F 3/242 | | |
| | | | 327/538 | | |
| 2006/0273846 A1 * | 12/2006 | Lee | G11C 29/02 | | |
| | | | 327/538 | | |
| 2007/0058457 A1 * | 3/2007 | Kim | G11C 5/147 | | |
| | | | 365/189.09 | | |
| 2007/0070719 A1 * | 3/2007 | Kim | G11C 7/06 | | |
| | | | 365/189.09 | | |
| 2007/0153590 A1 * | 7/2007 | Seo | G11C 5/147 | | |
| | | | 365/189.09 | | |
| 2007/0165462 A1 * | 7/2007 | Cheng | G11C 5/147 | | |
| | | | 365/189.09 | | |
| 2007/0194810 A1 * | 8/2007 | Hannah | H03K 19/094 | | |
| | | | 326/115 | | |
| 2007/0200600 A1 * | 8/2007 | Kang | G11C 5/147 | | |
| | | | 327/77 | | |
| 2007/0201104 A1 * | 8/2007 | Kihara | H04L 25/40 | | |
| | | | 358/434 | | |
| 2007/0201284 A1 * | 8/2007 | Kang | G11C 11/4074 | | |
| | | | 365/222 | | |
| 2007/0257729 A1 * | 11/2007 | Pigott | G05F 3/30 | | |
| | | | 327/539 | | |

(56)                References Cited

U.S. PATENT DOCUMENTS

| | | | | |
|---|---|---|---|---|
| 2008/0054305 | A1* | 3/2008 | Chang | H01L 29/7371 257/197 |
| 2008/0079399 | A1* | 4/2008 | Schiller | H02J 7/345 320/166 |
| 2008/0136381 | A1* | 6/2008 | Yang | G11C 5/147 365/189.09 |
| 2008/0170454 | A1* | 7/2008 | Pelli | G11C 16/28 365/210.1 |
| 2008/0195987 | A1* | 8/2008 | Bernstein | G06F 30/327 716/106 |
| 2008/0225609 | A1* | 9/2008 | Lee | G11C 7/1078 365/189.09 |
| 2008/0239856 | A1* | 10/2008 | Thorp | G11C 5/147 365/226 |
| 2008/0315855 | A1* | 12/2008 | Xiao | G05F 3/30 327/539 |
| 2009/0168585 | A1* | 7/2009 | Kang | G11C 11/4074 365/226 |
| 2009/0189683 | A1* | 7/2009 | Wu | G05F 3/30 327/543 |
| 2010/0073070 | A1* | 3/2010 | Ng | G05F 3/30 327/539 |
| 2010/0157697 | A1* | 6/2010 | Sato | G11C 5/147 365/189.11 |
| 2010/0188117 | A1* | 7/2010 | Street | H03K 19/1733 326/38 |
| 2010/0194412 | A1* | 8/2010 | Cho | G11C 5/147 324/705 |
| 2010/0207649 | A1* | 8/2010 | Krishnan | G01R 31/52 324/762.02 |
| 2010/0327930 | A1* | 12/2010 | Yan | H03K 3/3565 327/206 |
| 2012/0008431 | A1* | 1/2012 | Lee | G11C 11/406 327/392 |
| 2012/0051157 | A1* | 3/2012 | Nakanishi | G11C 5/147 365/189.09 |
| 2012/0146712 | A1* | 6/2012 | Kull | G11C 5/147 327/530 |
| 2012/0169396 | A1* | 7/2012 | Jang | G11C 5/147 327/333 |
| 2012/0256675 | A1* | 10/2012 | Lee | G11C 5/147 327/333 |
| 2012/0313696 | A1* | 12/2012 | Tejada | G11C 5/143 323/234 |
| 2013/0088258 | A1* | 4/2013 | Yokou | G11C 11/4093 326/30 |
| 2013/0147545 | A1* | 6/2013 | Kim | G11C 29/12005 327/541 |
| 2013/0278453 | A1* | 10/2013 | Steensgaard-Madsen | H03M 1/201 341/110 |
| 2013/0293289 | A1* | 11/2013 | Ivanov | G05F 3/205 327/539 |
| 2014/0049243 | A1* | 2/2014 | Huang | G05F 1/648 323/312 |
| 2014/0084331 | A1* | 3/2014 | Parthasarathy | H01L 27/0605 257/121 |
| 2014/0233337 | A1* | 8/2014 | Kim | G11C 5/145 365/226 |
| 2015/0194195 | A1* | 7/2015 | Yu | G11C 7/1084 327/109 |
| 2015/0227156 | A1* | 8/2015 | Kobayashi | G05F 3/16 323/268 |
| 2015/0268103 | A1* | 9/2015 | Wu | G06K 19/0717 374/1 |
| 2015/0348603 | A1* | 12/2015 | Lee | G11C 29/028 365/189.09 |
| 2015/0365112 | A1* | 12/2015 | Alon | H03F 3/213 327/539 |
| 2016/0064928 | A1* | 3/2016 | Jäntti | G06F 1/3296 307/33 |
| 2016/0259385 | A1* | 9/2016 | Tang | G06F 13/4072 |
| 2016/0266598 | A1* | 9/2016 | Wong | G05F 3/267 |
| 2016/0274616 | A1* | 9/2016 | Roy | G05F 3/267 |
| 2017/0154653 | A1* | 6/2017 | Sun | G11C 7/1084 |
| 2017/0177017 | A1* | 6/2017 | Horng | G05F 3/16 |
| 2017/0316811 | A1* | 11/2017 | Benedict | G11C 5/147 |
| 2018/0046211 | A1* | 2/2018 | Vilas Boas | G05F 1/575 |
| 2018/0137924 | A1* | 5/2018 | Keh | G11C 16/30 |
| 2018/0374516 | A1* | 12/2018 | Ochiai | G11C 11/419 |
| 2019/0164594 | A1* | 5/2019 | Eom | G11C 11/4087 |
| 2019/0199347 | A1* | 6/2019 | Joo | H03K 17/693 |
| 2019/0204863 | A1* | 7/2019 | Chien | H03F 3/4508 |
| 2019/0378794 | A1* | 12/2019 | Sharma | G05F 3/20 |
| 2020/0077479 | A1* | 3/2020 | DeJonge | H05B 47/19 |
| 2020/0185041 | A1* | 6/2020 | Baek | G11C 16/08 |
| 2020/0286574 | A1* | 9/2020 | Kunz | G05F 3/262 |
| 2020/0344848 | A1* | 10/2020 | DeJonge | H05B 47/10 |
| 2020/0350875 | A1* | 11/2020 | Parthasarathy | H03F 3/195 |
| 2021/0118485 | A1* | 4/2021 | Lim | G11C 13/0004 |
| 2021/0288648 | A1* | 9/2021 | Hanagami | H03K 19/1737 |
| 2022/0094576 | A1* | 3/2022 | Zhang | G11C 7/10 |
| 2022/0101904 | A1* | 3/2022 | Kim | G11C 11/2273 |
| 2023/0068318 | A1* | 3/2023 | Geiger | H01L 21/8252 |
| 2023/0361059 | A1* | 11/2023 | Fisher | H01L 29/2003 |

* cited by examiner

DIGITAL LOGIC COMPATIBLE INPUTS IN COMPOUND SEMICONDUCTOR CIRCUITS

FIELD OF THE INVENTION

The invention relates to compound semiconductor circuits generally and, more particularly, to a method and/or apparatus for implementing digital logic compatible inputs in compound semiconductor based integrated circuits.

BACKGROUND

Digital logic circuits are designed to input and output two types of signals: a logic "1" or HIGH and a logic "0" or LOW. The HIGH state is typically represented by the full supply voltage and the LOW state is typically represented by a circuit ground potential. However, real digital circuits cannot output ideal voltage levels, and are designed to accept substantial deviation from the ideal values. Conventional compound semiconductor integrated circuits (ICs), such as gallium arsenide (GaAs) based ICs, are typically paired with silicon ICs to facilitate digital control of the compound semiconductor ICs.

It would be desirable to implement digital logic compatible inputs in compound semiconductor based integrated circuits.

SUMMARY

The invention concerns an apparatus including a device comprising a semiconductor junction configured to generate a reference voltage, a voltage divider circuit, a comparator circuit, and a first output circuit. The voltage divider circuit may be configured to generate a first predetermined threshold voltage in response to the reference voltage. The comparator circuit may be configured to generate a first intermediate signal in response to a comparison of the first predetermined threshold voltage and an input signal. The first output circuit may be configured to generate a first output signal in response to the first intermediate signal.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing digital logic compatible inputs in compound semiconductor based integrated circuits that may (i) provide input threshold voltage level(s) that is(are) stable over variations in process, voltage, and/or temperature (PVT), (ii) allow CMOS logic level control of III-V compound semiconductor circuits, (iii) be implemented using gallium arsenide (GaAs) process technology, (iv) be utilized to implement circuits that transition to predefined voltage levels at predefined thresholds, (v) utilize a semiconductor junction as a bandgap reference, and/or (vi) be implemented as one or more integrated circuits.

Figure 1:
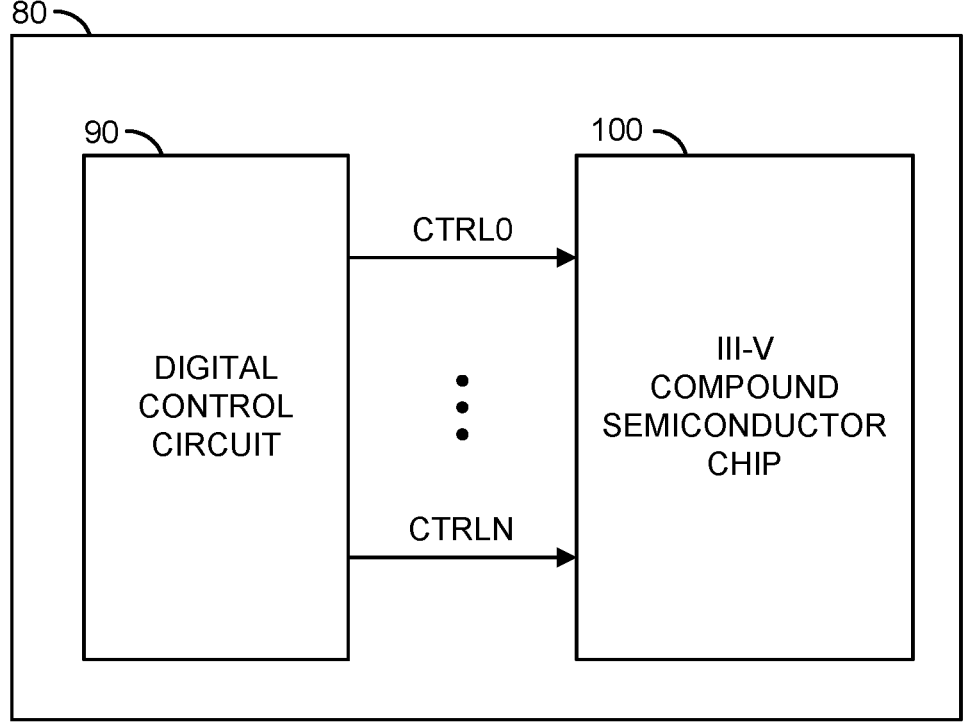
FIG. 1 is a diagram of a system illustrating a context of the invention.

Referring to FIG. 1, a block diagram of a system 80 is shown illustrating an example context of the invention. The system (or module or circuit or apparatus) 80 may implement, for example, a communication system. In some embodiments, the system 80 may implement a wireless communication system. In an example, the system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radiocommunication Sector (ITU-R)), a satellite communication (SATCOM) system, and/or a point-to-point communications system such as common data link (CDL). However, other communications standards may be implemented to meet the design criteria of a particular application. In an example, the system 80 may be configured to operate at common wireless radio frequencies, millimeter-wave frequencies, and/or microwave frequencies. In an example, system may be configured to facilitate communication with and/or between a plurality of communications devices (or terminals). In an example, the communications devices may include, but are not limited to, cellular telephones, mobile devices, tablets, and internet-of-things (IoT) equipment.

In various embodiments, the system 80 may comprise a block (or circuit or module) 90 and a block (or circuit or module) 100. In an example, the circuit 90 may implement a digital control circuit portion of the system 80. In an example, the circuit 100 may implement a variety of circuit elements of a communication system. In various embodiments, the circuit 100 may be implemented using a III-V compound semiconductor technology (e.g., GaAs, GaN, InP, InGaP, SiC, etc.). In an example, the circuit 90 may be configured to generate a number of signals (e.g., CTRL0-CTRLN). In an example, the signals CTRL0-CTRLN may be implemented as digital control signals. In an example, each of the signals CTRL0-CTRLN may have a first state (e.g., a logic 0 or LOW) and a second state (e.g., a logic 1 or HIGH). Each of the first and the second states may be represented by a predefined voltage level or voltage range. In an example, the signals CTRL0-CTRLN may be implemented having CMOS logic compliant levels. In an example, the circuit 100 may comprise a variety of high frequency (e.g., radio, millimeter-wave, microwave, etc.) circuits including, but not limited to, power amplifier (PA) stages, variable gain amplifier (VGA) stages, variable phase shift stages, filters, and switches. In an example, respective bias, phase, and/or gain values of the circuit 100 may be programmed in response to the signals CTRL0-CTRLN.

In an example, the circuit 90 may implement a control circuit. In various embodiments, the circuit 90 may be implemented using one or more of an application specific integrated circuit (ASIC), controller, microprocessor, or circuitry configured accordingly. The circuit 90 is generally operational to control the operations of the of the system 80 and the circuit 100. In some embodiments, the circuit 90 may determine setting, configuration, and/or operating values used in the circuit 100. In various embodiments, the circuit 90 may be implemented as one or more integrated circuits.

Figure 2:
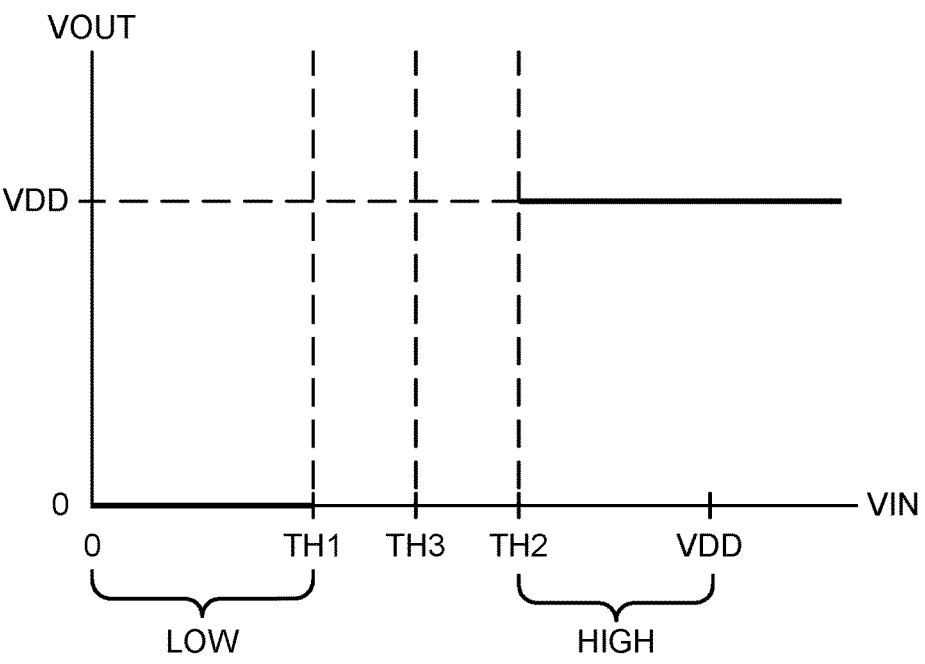
FIG. 2 is a diagram illustrating a transfer function in accordance with an example embodiment of the invention.

Referring to FIG. 2, a diagram is shown illustrating a control signal transfer function in accordance with an embodiment of the invention. In an example, the circuit 100 may be configured to receive the number of signals (e.g., CTRL0-CTRLN). In an example, the signals CTRL0-CTRLN may be implemented as digital control signals. Each of the signals CTRL0-CTRLN may have a first state (e.g., a logic 0 or LOW) and a second state (e.g., a logic 1 or HIGH). The first state may be represented by a first predefined threshold (e.g., TH1). The second state may be represented by a second predefined threshold (e.g., TH2). When the control signals CTRL0-CTRLN have a voltage level in a range from zero (ground potential) up to and including TH1, the signals CTRL0-CTRLN are considered to be a logic 0 or LOW. When the control signals CTRL0-CTRLN have a voltage level in a range from TH2 up to and including VDD, the signals CTRL0-CTRLN are considered to be a logic 1 or HIGH. In an example, the signals CTRL0-CTRLN may be implemented having CMOS logic compliant levels, where VDD is 5V, TH1 is 1.5V, and TH2 is 3.5V. However, other signal specifications may be implemented accordingly to meet design criteria of a particular implementation.

In general, gate circuit interpretations for signals having a voltage level between the thresholds TH1 and TH2 are not guaranteed. In an example, a threshold (e.g., TH3) may be defined in order to allow interpretation of signals that fall slightly out of the specified ranges. In an embodiment implement the TH3 threshold, when a signal has a voltage level below TH3, the signal may be considered to be a logic 0 or LOW, and when the signal has a voltage level above TH3, the signal may be considered to be a logic 1 or HIGH.

Figure 3:
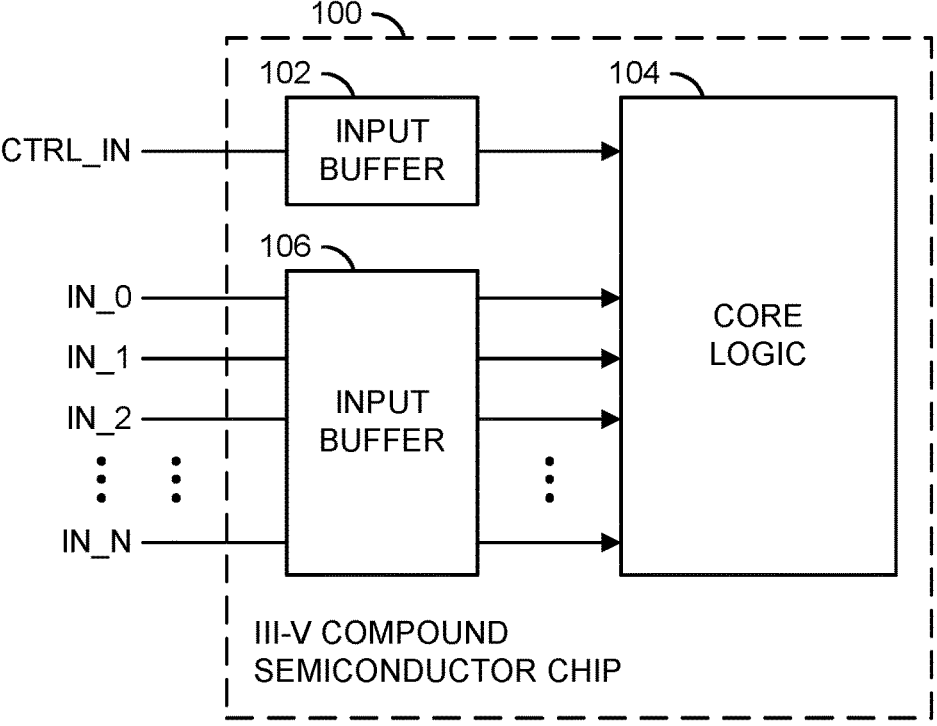
FIG. 3 is a diagram illustrating an integrated circuit context in accordance with an example embodiment of the invention.

Referring to FIG. 3, a diagram of a circuit 100 is shown illustrating an integrated circuit context in accordance with an example embodiment of the invention. In various embodiments, the circuit 100 may comprise a III-V compound semiconductor integrated circuit. In an example, the circuit 100 may be implemented using process technology including, but not limited to, gallium arsenide (GaAs), indium gallium phosphide (InGaP), indium phosphide (inP), gallium nitride (GaN), and silicon carbide (SiC). In various embodiments, the circuit 100 may be configured to work with standard digital logic (e.g., CMOS, TTL, etc.) signals. In an example, compatibility with standard digital logic control signals (e.g., CMOS, etc.) generally facilitates easy integration of high power, high speed III-V compound semiconductor integrated circuits with CMOS control circuits. The circuit 100 is generally configured to allow direct application of externally generated digital logic level (e.g., CMOS, etc.) control signals to input pins (or pads) of the circuit 100. The circuit 100 is generally configured to generate internal control signals in response to externally generated digital logic level (e.g., CMOS, etc.) control signals.

In various embodiments, the circuit 100 may comprise a block (or circuit) 102, a block (or circuit) 104, a block (or circuit) 106, and or any combination or number thereof. In an example, the circuit 102 may implement a single-bit input buffer circuit. In an example, the circuit 104 may implement internal (core) circuitry of the circuit 100. In an example, the circuit 106 may implement a multi-bit input buffer circuit. The circuit 102 and/or the circuit 106 are generally configured to provide a digital control interface between the circuit 104 and external circuitry connected to the circuit 100. In various embodiments, the circuit 102 may have an input that receives an external control signal (e.g., CTRL_IN) and one or more outputs that present one or more internal control signals to the circuit 104. In an example, the input of the circuit 102 may be configured to receive the external signal via a connection (e.g., a pin, a pad, a bump, or other method of electrically connecting the circuit 100 to external circuitry) to an external source. In various embodiments, the external signal may be characterized as having at least two logic states (e.g., a logic LOW and a logic HIGH) represented by predefined voltage levels (e.g., CMOS levels, etc.). The circuit 102 may be configured to generate the internal control signal(s) responsive to a particular state of the input signal CTRL_IN.

In various embodiments, the circuit 106 may have a number (e.g., n) of inputs that receive a corresponding number of external control signals (e.g., IN_0-IN_N) and a corresponding number (e.g., n, $2n$, $2^n$, etc.) of outputs that present internal control signals to the circuit 104. In an example, the inputs of the circuit 106 may be configured to receive the external signals via respective connections (e.g., pins, pads, bumps, or other method of electrically connecting the circuit 100 to external circuitry) to an external source or sources. In various embodiments, the external signals may be characterized as having at least two logic states (e.g., a logic LOW and a logic HIGH) represented by predefined voltage levels (e.g., CMOS levels, etc.). The circuit 106 may be configured to generate the internal control signals responsive to particular states of the input signals IN_0-IN_N.

In an example, the circuit 104 may comprise a variety of high frequency, (e.g., radio, millimeter-wave, microwave, etc.) circuits including, but not limited to, power amplifier (PA) stages, variable gain amplifier (VGA) stages, variable phase shift stages, filters, and switches. In an example, respective bias, phase, and/or gain values of the circuit 100 may be programmed in response to the internal control signals received from the circuit 102 and/or the circuit 106. In another example, signal paths may be controlled by one or more switches within the circuit 104 to vary signal routs in response to one or more of the internal control signals.

Figure 4:
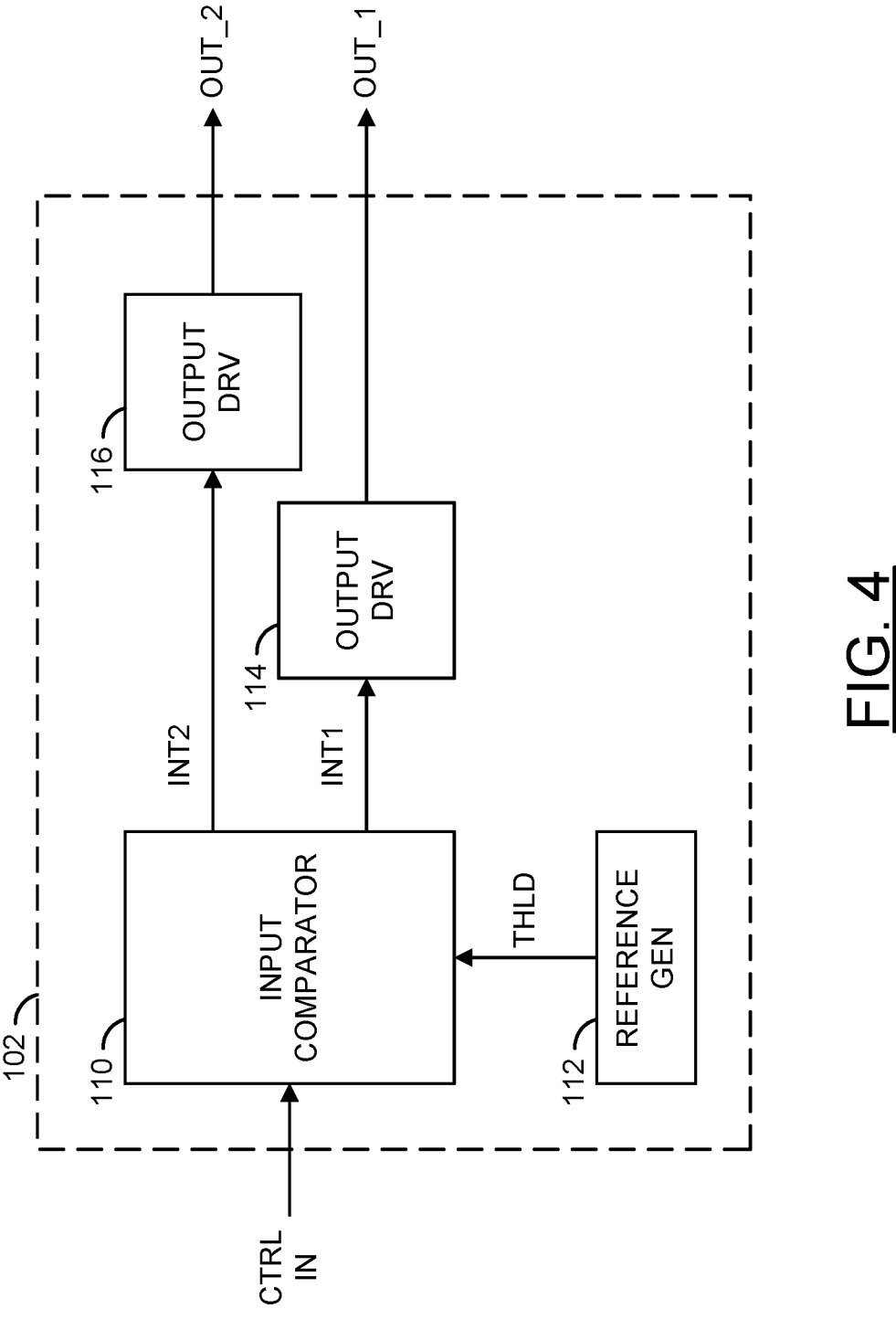
FIG. 4 is a diagram illustrating an example single-bit input buffer circuit in accordance with an example embodiment of the invention.

Referring to FIG. 4, a block diagram of the circuit 102 is shown illustrating an example implementation of a single-bit input buffer circuit in accordance with an example embodiment of the invention. In an example, the circuit 102 may comprise a block (or circuit) 110, a block (or circuit) 112, a block (or circuit) 114, and a block (or circuit) 116. The block 110 may implement an input comparator circuit. The block 112 may implement a reference generator circuit. The blocks 114 and 116 may implement output driver circuits. In an example, the circuit 110 may have a first input that may receive the signal CTRL_IN, a second input that may receive a predefined threshold voltage (e.g., THLD), and one or more outputs that may present a respective intermediate signal. The circuit 110 may be configured to generate the one or more intermediate signals in response to the signals CTRL_IN and THLD. In an example, a value of the one or more intermediate signals may be based upon a comparison between a voltage level of the signal CTRL_IN and a voltage level of the signal THLD.

The circuit 112 may be configured to generate the predefined threshold voltage THLD based upon a substantially stable characteristic of the III-V compound semiconductor material. In an example, the circuit 112 may be implemented as a bandgap reference voltage generator. In an example, the circuit 112 may use a junction of the compound semiconductor to produce a reference voltage level that is substantially stable over process, voltage, and temperature (PVT) corners of the particular semiconductor technology. In an example, the circuit 112 may be configured to generate the signal THLD as the threshold value TH3 in FIG. 2.

Each of the circuits 114 and 116 may receive a respective intermediate signal from the circuit 110. The circuit 114 may be configured to generate a respective output signal (e.g., OUT_1) in response to the respective intermediate signal received from the circuit 110. The circuit 116 may be configured to generate a respective output signal (e.g., OUT_2) in response to the respective intermediate signal received from the circuit 110. The signals OUT_1 and OUT_2 are generally configured to control respective portions of the core circuitry 104.

Figure 5:
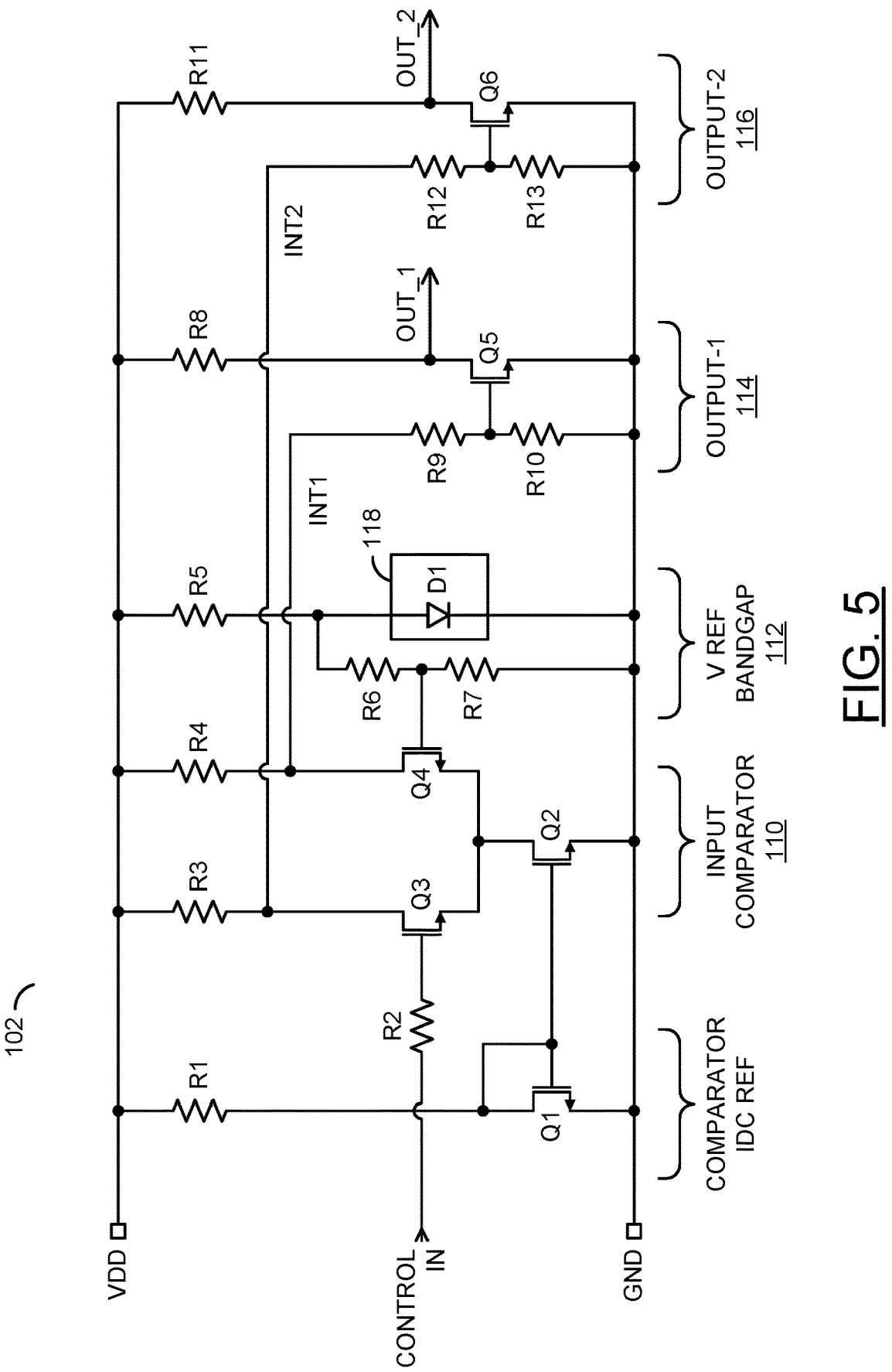
FIG. 5 is a diagram illustrating an example implementation of the input buffer circuit of FIG. 4.

Referring to FIG. 5, a schematic diagram is shown illustrating an example implementation of the single-bit input buffer circuit 102 of FIG. 4. In an example, the circuit 102 may implement the circuits 110-116 using a number of transistors Q1-Q6, a number of resistors R1-R13, and a semiconductor junction device 118. In an example, the circuit 110 may comprise transistors Q1-Q4 and resistors R1-R4. The resistor R1 may be connected between a positive supply voltage (e.g., VDD) and a drain terminal of the transistor Q1. The drain terminal of the transistor Q1 may be connected to a gate terminal of the transistor Q1 and a gate terminal of the transistor Q2. A source terminal of the transistor Q1 and a source terminal of the transistor Q2 may be connected to a circuit ground potential (e.g., GND). A drain terminal of the transistor Q2 may be connected to source terminals of the transistors Q3 and Q4. The resistor R2 may be configured to couple the signal CTRL_IN to a gate terminal of the transistor Q3. The resistor R3 may be connected between the positive supply voltage VDD and a drain terminal of the transistor Q3. The resistor R4 may be connected between the positive supply voltage VDD and a drain terminal of the transistor Q4.

The transistors Q1 is generally configured to generated a reference current. The reference current is generally mirrored by the transistor Q2 for use in a differential comparator formed by the transistors Q3 and Q4. The differential comparator formed by the transistor Q3 and Q4 compares the voltage level of the signal CTRL_IN presented to the gate of the transistor Q3 to a reference voltage level presented to a gate of the transistor Q4. Intermediate signals representative of the comparison are presented at the respective source terminals of the transistor Q3 and Q4.

In an example, the reference generator circuit 112 may be implemented as a bandgap reference. In an example, the resistor R5 may be connected between the positive supply voltage VDD and first terminal of the semiconductor junction device 118. A second terminal of the semiconductor junction device 118 may be connected to the ground potential GND. The semiconductor junction device 118 is generally configured to present a bandgap voltage of the particular compound semiconductor material (e.g., 1.42V for GaAs). In an example, the semiconductor junction device 118 may be implemented as a diode junction, transistor junction, parasitic junction, or other junction type that may be produced in a particular semiconductor technology.

In various embodiments, the voltage presented at the first terminal of the semiconductor junction device 118 is presented to a voltage divider formed by the resistors R6 and R7. In an example, the first terminal of the semiconductor junction device 118 is connected to a first terminal of the resistor R6. A second terminal of the resistor R6 is connected to a first terminal of the resistor R7 and the gate terminal of the transistor Q4. A second terminal of the resistor R7 is connected to the ground potential GND. The values of the resistors R6 and R7 are generally selected to produce a desired threshold level (e.g., TH3).

In an example, the output driver circuit 114 may be implemented with the transistor Q5 and the resistors R8-R10. The resistor R8 may be connected between the positive supply voltage VDD and a drain terminal of the transistor Q5. A source terminal of the transistor Q5 may be connected to the ground potential GND. A gate terminal of the transistor Q5 may be connected to a first terminal of the resistor R9 and a first terminal of the resistor R10. A second terminal of the resistor R9 may be connected to the drain terminal of the transistor Q4. A second terminal of the resistor R10 may be connected to the circuit ground potential GND. The output signal OUT 1 may be presented at the drain terminal of the transistor Q5. The values of the resistors R9 and R10 are generally selected to produce a desired switch point for the transistor Q5.

In an example, the output driver circuit 116 may be implemented with the transistor Q6 and the resistors R11-R13. The resistor R11 may be connected between the positive supply voltage VDD and a drain terminal of the transistor Q6. A source terminal of the transistor Q6 may be connected to the ground potential GND. A gate terminal of the transistor Q6 may be connected to a first terminal of the resistor R12 and a first terminal of the resistor R13. A second terminal of the resistor R12 may be connected to the drain terminal of the transistor Q3. A second terminal of the resistor R13 may be connected to the circuit ground potential GND. The output signal OUT_2 may be presented at the drain terminal of the transistor Q6. The values of the resistors R12 and R13 are generally selected to produce a desired switch point for the transistor Q6.

Figure 6:
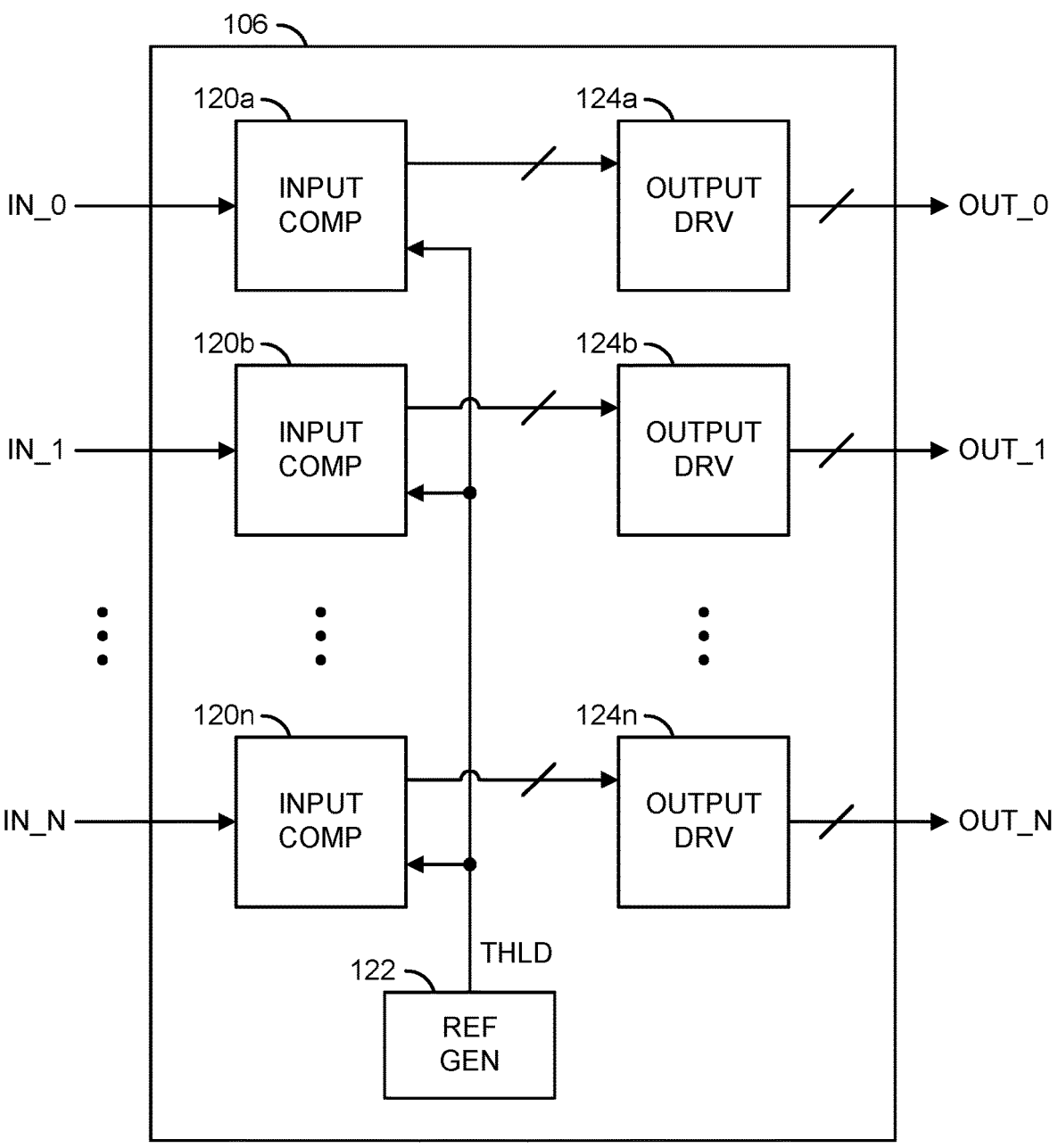
FIG. 6 is a diagram illustrating an example multi-bit input buffer circuit in accordance with another example embodiment of the invention.

Referring to FIG. 6, a block diagram is shown illustrating an example implementation of the multi-bit input buffer circuit 106 of FIG. 3. In an example, the circuit 106 may comprise a number of blocks (or circuits) 120a-120n, a block (or circuit) 122, and a number of blocks (or circuits) 124a-124n. The blocks 120a-120n may implement input comparator circuits. The block 112 may implement a reference generator circuit. The blocks 124a-124n may implement output driver circuits. In an example, each of the circuits 120a-120n may have a first input that may receive a respective one of the signals IN_0-IN_N, a second input that may receive a predefined threshold voltage (e.g., THLD), and one or more outputs that may present a respective intermediate signal. The circuits 120a-120n may be configured to generate the one or more intermediate signals in response to the respective one of the signals IN_0-IN_N and the signal THLD. In an example, a value of the one or more intermediate signals may be based upon a comparison between a voltage level of the respective one of the signals IN_0-IN_N and a voltage level of the signal THLD.

The circuit 122 may be configured to generate the predefined threshold voltage THLD based upon a substantially stable junction potential characteristic of the III-V compound semiconductor material. In an example, the circuit 122 may be implemented as a bandgap reference voltage generator. In an example, the circuit 122 may use a junction device of the compound semiconductor to produce a reference voltage level that is substantially stable over process, voltage, and temperature (PVT) corners of the particular semiconductor technology. In an example, the circuit 122 may be configured to generate the signal THLD as the threshold value TH3 in FIG. 2.

Each of the circuits 124a-124n may receive a respective intermediate signal from a corresponding circuit 120a-120n. The circuits 124a-124n may be configured to generate respective output signals (e.g., OUT_0-OUT_N) in response to the respective intermediate signal received from the corresponding circuit 120a-120n. In some embodiments, a number of blocks (or circuits) 124a-124n may be implemented similarly to the circuit 116 of FIG. 4 and configured to generate a second set of respective output signals in response to a respective intermediate signal received from the circuits 120a-120n. The signals OUT_0GOUT_N are generally configured to control respective portions of the core circuitry 104.

Figure 7:
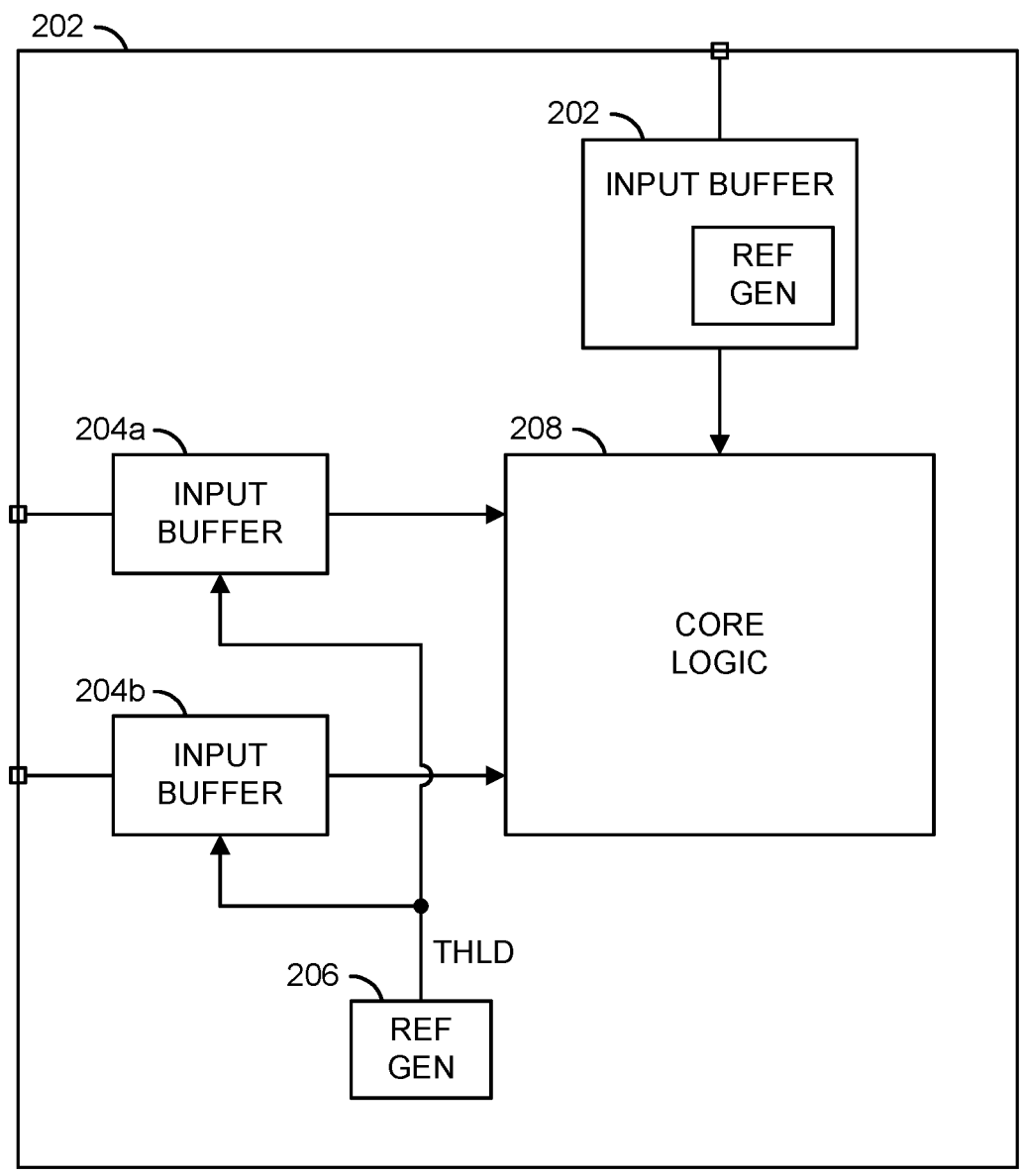
FIG. 7 is a diagram illustrating an integrated circuit in accordance with another example embodiment of the invention.

Referring to FIG. 7, a diagram of an integrated circuit 200 is shown illustrating another example implementation in accordance with an example embodiment of the invention. In various embodiments, the circuit 200 may comprise a III-V compound semiconductor integrated circuit. In an example, the circuit 200 may be implemented using process technology including, but not limited to, gallium arsenide (GaAs), indium phosphide (InP), indium gallium phosphide (InGaP), gallium nitride (GaN) and silicon carbide (SiC). In various embodiments, the circuit 200 may be configured to work with standard digital logic (e.g., CMOS, TTL, etc.) signals. In an example, compatibility with standard digital logic control signals (e.g., CMOS, etc.) generally facilitates easy integration of high power, high speed III-V compound semiconductor integrated circuits with CMOS control circuits. The circuit 200 is generally configured to allow direct application of externally generated digital logic level (e.g., CMOS, etc.) control signals to input pins (or pads) of the circuit 200. The circuit 200 is generally configured to generate internal control signals in response to externally generated digital logic level (e.g., CMOS, etc.) control signals.

In various embodiments, the circuit 200 may comprise a block (or circuit) 202, a number of blocks (or circuits) 204a-204b, a block (or circuit) 206, a block (or circuit) 208, and or any combination or number thereof. In an example, the circuit 202 may implement a single-bit input buffer circuit with integrated reference generator. In an example, the circuits 204a-204b may implement single-bit input buffer circuits without internal reference generators. The circuit 206 may implement a reference generator circuit for providing a reference voltage to the circuit 204a and 204b. The circuit 208 may implement internal (core) circuitry of the circuit 200. The circuit 202 and/or the circuits 204a and 204b are generally configured to provide a digital control interface between the circuit 208 and external circuitry connected to the circuit 200 (e.g., via pins, pads, bumps, or other method of electrically connection). In various embodiments, the external signal may be characterized as having at least two logic states (e.g., a logic LOW and a logic HIGH) represented by predefined voltage levels (e.g., CMOS levels, etc.).

In an example, the reference threshold voltage source 206 may be placed individually near an input buffer (comparator), or shared between multiple input buffers (comparators). The implementation of shared versus individual reference generators may be a matter of balancing current consumption reduction versus physical layout and routing constraints. In general, when I/O blocks (or circuits) need to be spread across (or around) the die or there are signal routing constraints, the threshold reference generators may be duplicated and placed where needed.

Although embodiments of the invention have been described in the context of a 5G application, the present invention is not limited to 5G applications, but may also be applied in other high power, high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing power, increasing speed, increasing flexibility, and increasing numbers of interconnections and layers. The present invention may also be applicable to wireless communications systems implemented in compliance with either existing (legacy, 2G, 3G, 4G) specifications or future specifications.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method of generating an internal control signal in a compound semiconductor integrated circuit comprising a compound semiconductor material, said method comprising:

generating, in the compound semiconductor integrated circuit, a bandgap voltage using a semiconductor junction formed in said compound semiconductor material, the bandgap voltage having a voltage value corresponding to said compound semiconductor material;

generating, in the compound semiconductor integrated circuit, a first predetermined threshold voltage by providing the bandgap voltage, from a node between a terminal of the semiconductor junction and a positive power supply, to a voltage divider and setting an output of the voltage divider as the first predetermined threshold voltage, the first predetermined threshold voltage corresponding to a threshold voltage value disposed between a range of voltage values corresponding to a logical high state and a range of voltage values corresponding to a logical low state;

obtaining, in the compound semiconductor integrated circuit, an input signal from a digital control circuit external to the compound semiconductor integrated circuit, said input signal having a voltage outside of:

the range of voltage values corresponding to said logical low state; and the range of voltage values corresponding to said logical high state;

generating, in the compound semiconductor integrated circuit, a first intermediate signal based on a comparison of said first predetermined threshold voltage and said voltage of said input signal; and generating, in the compound semiconductor integrated circuit, a first output signal based on said first intermediate signal, wherein said first output signal has a first level when said voltage of said input signal is less than said first predetermined threshold voltage and a second level when said voltage of said input signal is greater than said first predetermined threshold voltage, wherein the first output signal is configured to control an internal circuitry of the compound semiconductor integrated circuit.

2. The method according to claim 1, further comprising:

generating a second intermediate signal based on the comparison of the first predetermined threshold voltage and the voltage of the input signal; and generating a second output signal based on the second intermediate signal.

3. The method according to claim 2, wherein:

the second intermediate signal is a complement of the first intermediate signal.

4. The method according to claim 2, wherein:

the second output signal is a complement of the first output signal.

5. The method according to claim 1, wherein said compound semiconductor material comprises a III-V compound semiconductor material.

6. The method according to claim 1, wherein said compound semiconductor material comprises at least one of a gallium arsenide alloy, a gallium nitride alloy, an indium phosphide alloy, an indium gallium phosphide alloy, a silicon carbide alloy.

7. The method according to claim 1, wherein said semiconductor junction comprises at least one of a diode junction, a transistor junction, and a parasitic junction.

8. The method according to claim 1, wherein said first predetermined threshold voltage is selected to be compliant with one or more digital logic standards.

9. The method according to claim 1, wherein said first predetermined threshold voltage is selected to be compliant with standard complementary metal-oxide-semiconductor (CMOS) logic levels.

10. The method according to claim 9, wherein said bandgap voltage has a value corresponding to a bandgap of said compound semiconductor material.

11. The method according to claim 9, wherein said bandgap voltage is substantially stable over process, voltage and temperature (PVT) corners of said compound semiconductor material.

12. The method according to claim 1, wherein generating said first predetermined threshold voltage based on said bandgap voltage comprises generating said first predetermined threshold voltage from said bandgap voltage using the voltage divider.

13. The method according to claim 1, wherein said digital control circuit comprises a semiconductor integrated circuit that is formed of a different material than said compound semiconductor integrated circuit.

* * * * *